US009042085B2

(12) United States Patent
Ramrattan (10) Patent No.: US 9,042,085 B2
(45) Date of Patent: May 26, 2015

(54) COMPONENT COVER HAVING VARIABLE LIGHT TRANSMISSIVITY (75) Inventor: Colin Shiva Ramrattan, Waterloo (CA)

(73) Assignee: BLACKBERRY LIMITED, Waterloo, Ontario (CA)

(*) Notice: Subject to any disclaimer, the term of this patent is extended or adjusted under 35 U.S.C. 154(b) by 1255 days.

(21) Appl. No.: 12/625,766

(22) Filed: Nov. 25, 2009

(65) Prior Publication Data
US 2011/0122554 A1 May 26, 2011

(51) Int. Cl.
H05K 5/00 (2006.01)
H05K 5/02 (2006.01)
G03B 17/00 (2006.01)

(52) U.S. Cl.
CPC .............. H05K 5/0243 (2013.01); G03B 17/00 (2013.01)

(58) Field of Classification Search
USPC .............. 361/679.01; 348/373; 396/448, 457, 396/506
See application file for complete search history.

(56) References Cited

U.S. PATENT DOCUMENTS

| 6,039,390 A * | 3/2000 | Agrawal et al. ............... 296/211 |
| 6,349,221 B1 * | 2/2002 | Wolf et al. ..................... 455/566 |
| 2007/0133983 A1 * | 6/2007 | Traff ............................. 396/506 |
| 2007/0153119 A1 | 7/2007 | Bilbrey |
| 2008/0080850 A1 * | 4/2008 | Amirzadeh et al. .......... 396/155 |
| 2008/0304819 A1 * | 12/2008 | Tolbert .......................... 396/448 |

FOREIGN PATENT DOCUMENTS

EP  1467536 A1 * 10/2004 ............. H04M 1/02
WO  2008149179 A1  12/2008

OTHER PUBLICATIONS

European Examination Report. European Application No. 09177097.4. Dated: Apr. 1, 2010.
European Communication under Rule 71(3) EPC ( European Application No. 09177097.4) dated Jul. 29, 2010.
Wikipedia.org, "Smart glass". accessed on Jun. 25, 2009. Available online: http://en.wikipedia.org/wiki/smart_glass.
Document relating to Canadian Patent Application No. 2,721,994, dated Oct. 28, 2013 (Notice of Allowance).
Office Action received on related Canadian Patent Application No. 2,721,994, dated Jul. 27, 2012.
Second Office Action received on related Canadian Patent Application No. 2,721,994, dated Feb. 25, 2013.

* cited by examiner

Primary Examiner — Hung S Bui
Assistant Examiner — James Wu
(74) Attorney, Agent, or Firm — Perry + Currier Inc.

(57) ABSTRACT

In a broad aspect, embodiments described herein are generally directed to an electronic device comprising: a housing; a component mounted within the housing; a component cover in fixed relation to the housing; wherein the component cover is configurable between at least a first state and a second state; and wherein light transmissivity through the component cover is greater when in the second state than when in the first state. In some implementations, in the first state the component cover is substantially opaque, or in the second state the component cover is substantially transparent.

19 Claims, 8 Drawing Sheets

COMPONENT COVER HAVING VARIABLE LIGHT TRANSMISSIVITY

TECHNICAL FIELD

Embodiments described herein relate generally to the construction of housings of electronic devices.

BACKGROUND

Electronic devices are prevalent in our society today. They are increasing in functionality as such devices incorporate an increasing number of components to perform an increasing number of tasks. Some such components (for example, a camera lens and a camera flash, also referred to herein generally as 'camera' or 'flash' respectively) require openings in the housing of the electronic device for their operation, and are typically protected by a cover made of a transparent material (e.g. clear glass or plastic).

The opening in the housing of the electronic device for the component may make the appearance of the electronic device aesthetically unpleasing. For example, a camera flash may be of a colour that is different than the colour of the rest of the housing of the electronic device. This results in the flash standing out and not blending in with the remainder of the device housing, preventing a smooth and uniform appearance.

BRIEF DESCRIPTION OF THE DRAWINGS

For a better understanding of the described example embodiments and to show more clearly how they may be carried into effect, reference will now be made, by way of example, to the accompanying drawings in which.

DETAILED DESCRIPTION

In a broad aspect, embodiments described herein are generally directed to an electronic device comprising: a housing; a component mounted within the housing; a component cover in fixed relation to the housing; wherein the component cover is configurable between at least a first state and a second state. In some embodiments, light transmissivity through the component cover is greater when in the second state than when in the first state. In other implementations, in the first state the component cover is substantially opaque, or in the second state the component cover is substantially transparent.

In yet other implementations, the component cover in the first state may be coloured, wherein the colour of the component cover in the first state corresponds to the colour of at least a portion of the housing. Alternatively, the colour of at least a portion of the housing corresponds to the colour of the component cover in the first state.

In further embodiments, the component cover may be configurable to be translucent in at least one additional state.

Additionally, embodiments of an electronic device described herein may further comprise: a power supply operatively coupled to the component cover; and a cover controller operatively coupled to the power supply and configured to control the power supplied to the component cover by the power supply.

In some embodiments, the component cover may comprise electrochromic film. In other embodiments, the component cover may comprise at least one selected from the group consisting of: electrochromic glass, polymer dispersed liquid crystal film and a suspended particle device.

In other embodiments, the component comprises a camera lens. In further embodiments, the component comprises a camera flash.

The electronic device described herein may further comprise: at least one alternate component mounted within the housing; at least one alternate component cover in fixed relation to the housing; wherein the alternate component cover is separately configurable between at least a first state and a second state; and wherein light transmissivity through the alternate component cover is greater when in the second state than when in the first state.

In another broad aspect, embodiments described herein are generally directed to an electronic device comprising: a housing; a component mounted within the housing; a component cover in fixed relation to the housing; a power supply operatively coupled to the component cover; a cover controller operatively coupled to the power supply and configured to control the power supplied to the component cover by the power supply; and the component cover is configurable to vary its light transmissivity in response to the power supplied to the component cover by the power supply.

In some embodiments, the component cover may comprise electrochromic film. The component cover may additionally or alternatively comprise electrochromic glass. In one embodiment, the component cover comprises polymer dispersed liquid crystal film. In other embodiments, the component cover may comprise a suspended particle device.

In other embodiments, the component comprises at least one selected from the group consisting of: a camera lens and a camera flash.

In yet another broad aspect, embodiments described herein are generally directed to a method of varying the aesthetic properties of an electronic device, the method comprising: providing a housing for the electronic device; providing a component mounted within the housing; providing a component cover in fixed relation to the housing; and configuring the component cover between at least a first state and a second state. The light transmissivity through the component cover may be greater when in the second state than when in the first state. In some embodiments, the method may comprise configuring the component cover in the second state prior to using the component. In other embodiments, the method may comprise configuring the component cover in the first state when the component is not in use.

In further implementations, in the first state the component cover is substantially opaque, or in the second state the component cover is substantially transparent. In additional implementations, the component cover in the first state may be coloured, wherein the colour of the component cover in the first state corresponds to the colour of at least a portion of the housing. Alternatively, the colour of at least a portion of the housing corresponds to the colour of the component cover in the first state.

In yet further embodiments, the component cover may be configurable to be translucent in at least one additional state.

Additionally, the method of varying the aesthetic properties of an electronic device may further comprise: providing a power supply operatively coupled to the component cover; and providing a cover controller operatively coupled to the power supply and configured to control the power supplied to the component cover by the power supply.

In some embodiments, the component cover may comprise electrochromic film. In other embodiments, the component cover may comprise at least one selected from the group consisting of: electrochromic glass, polymer dispersed liquid crystal film and a suspended particle device.

In other embodiments, the component comprises a camera lens. In further embodiments, the component comprises a camera flash.

The method of varying the aesthetic properties of an electronic device may further comprise: providing at least one alternate component mounted within the housing; providing at least one alternate component cover in fixed relation to the housing; wherein the alternate component cover is separately configurable between at least a first state and a second state; and wherein light transmissivity through the alternate component cover is greater when in the second state than when in the first state.

These and other aspects and features of various embodiments will be described in greater detail below.

Some embodiments described herein make use of a mobile station as an exemplary electronic device. A mobile station is a two-way communication device with advanced data communication capabilities having the capability to communicate with other computer systems, and is also referred to herein generally as a mobile device. A mobile device may also include the capability for voice communications. Depending on the functionality provided by a mobile device, it may be referred to as a data messaging device, a two-way pager, a cellular telephone with data messaging capabilities, a wireless Internet appliance, or a data communication device (with or without telephony capabilities). A mobile device communicates with other devices through a network of transceiver stations.

Figure 1:
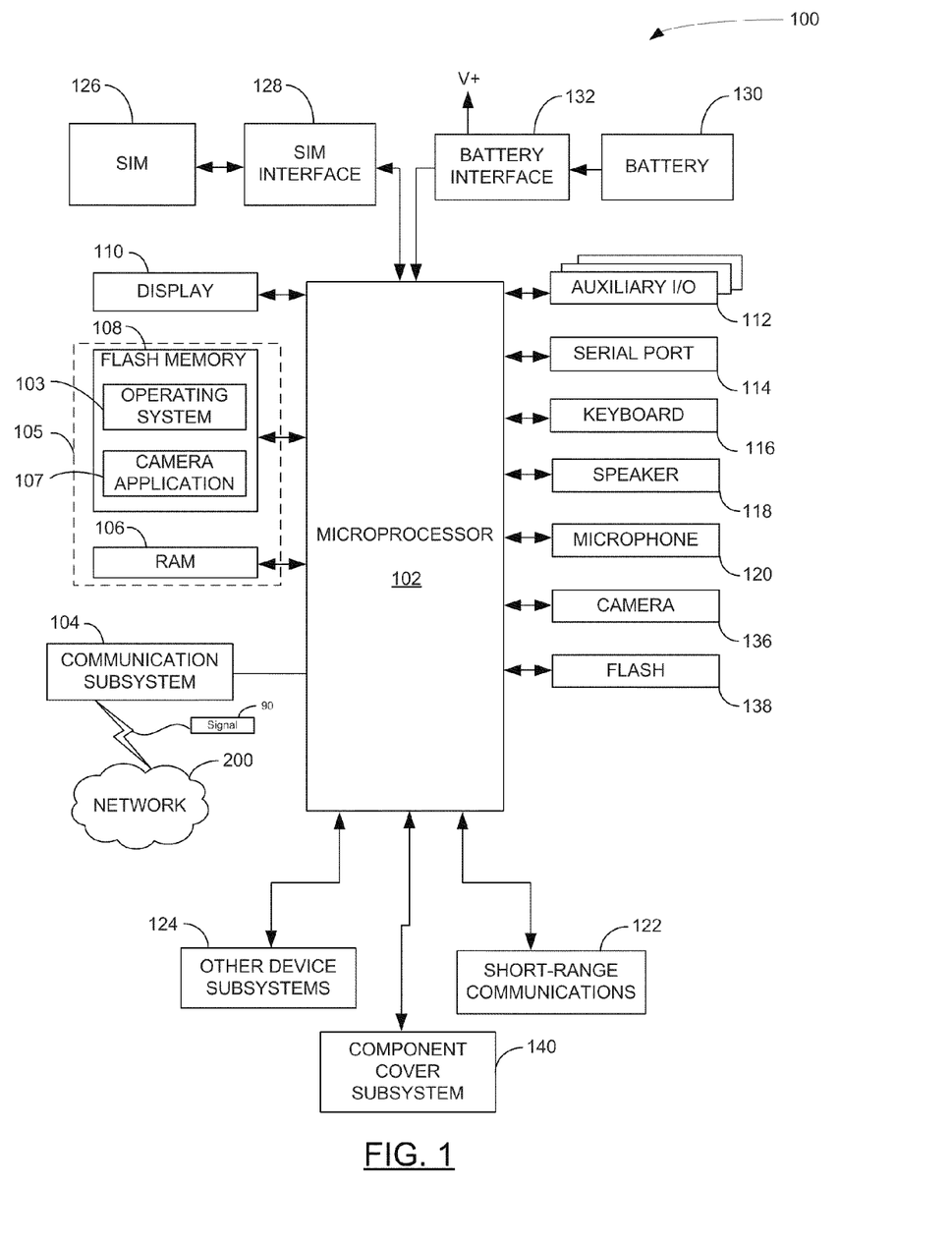
FIG. 1 is a block diagram of an electronic device in one example implementation.
Figure 2:
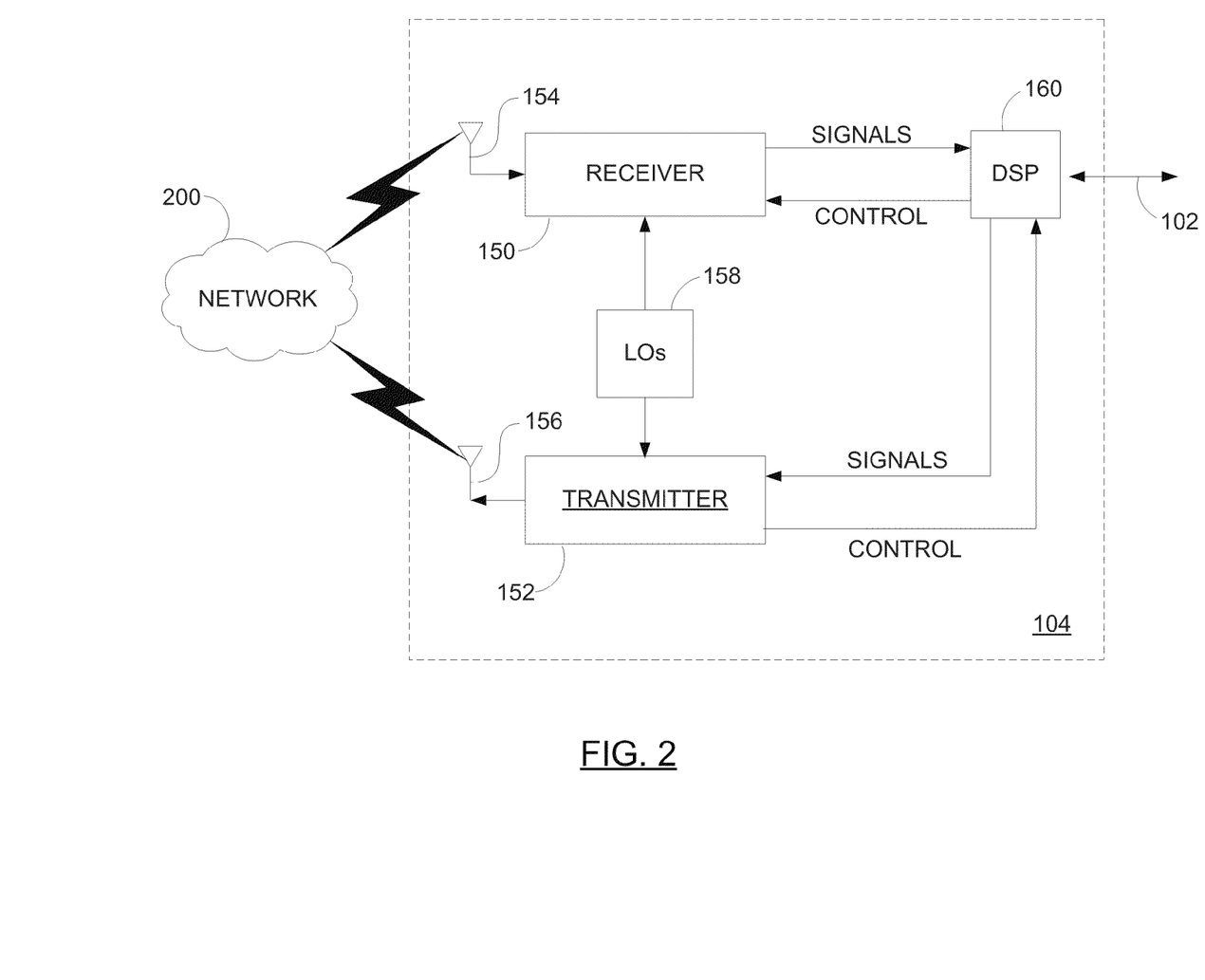
FIG. 2 is a block diagram of a communication sub-system component of the electronic device of FIG. 1.
Figure 3:
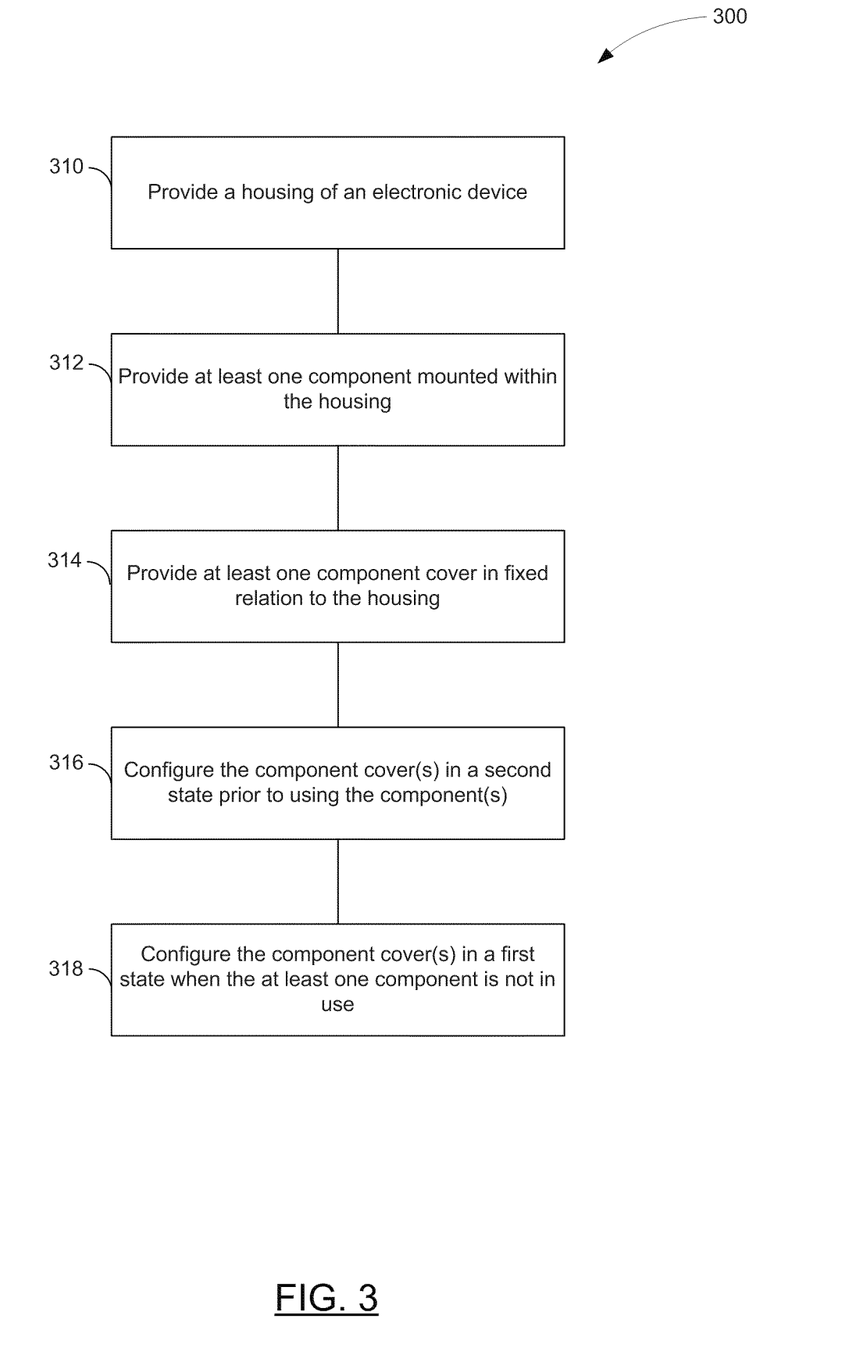
FIG. 3 is a flowchart of a method of varying the aesthetic properties of an electronic device in an exemplary embodiment.

To aid the reader in understanding the structure of a mobile device and how it communicates with other devices, reference is made to FIGS. 1 through 3. Nevertheless, it should be understood that embodiments of the present disclosure may not require the electronic device to be capable of communication with other devices.

Referring first to FIG. 1, a block diagram of a mobile device in one example implementation is shown generally as 100. Mobile device 100 comprises a number of components, the controlling component being microprocessor or CPU 102. Microprocessor 102 is typically programmed with an operating system 103 and controls the overall operation of mobile device 100. In some embodiments, certain communication functions, including data and voice communications, are performed through a communications module also referred to herein as a communication subsystem 104. Communication subsystem 104 receives communications signals 90 (also referred to herein as "messages") from and sends messages to a wireless network 200. By way of example only, such communication signals 90 may correspond to phone calls, email or other data messages.

In this example implementation of mobile device 100, communication subsystem 104 is configured for cellular communication in accordance with the Global System for Mobile Communication (GSM) and General Packet Radio Services (GPRS) standards. The GSM/GPRS wireless network is used worldwide and it is expected that these standards will be superseded eventually by Enhanced Data GSM Environment (EDGE) and Universal Mobile Telecommunications Service (UMTS).

New standards are still being defined, but it is believed that they will have similarities to the network behavior described herein, and it will also be understood by persons skilled in the art that the described embodiments are intended to use any other suitable standards that are developed in the future. The wireless link connecting communication subsystem 104 with network 200 represents one or more different Radio Frequency (RF) channels, operating according to defined protocols specified for GSM/GPRS communications. With newer network protocols, these channels are capable of supporting both circuit switched voice communications and packet switched data communications.

Although the wireless network associated with mobile device 100 is a GSM/GPRS wireless network in one example implementation of mobile device 100, other wireless networks may also be associated with mobile device 100 in variant implementations. Alternatively, the network and device 100 might employ WiFi/WiMax radios utilizing SIP (session initialization protocols) and VoIP (voice over internet protocols). Different types of wireless networks that may be employed include, for example, data-centric wireless networks, voice-centric wireless networks, and dual-mode networks that can support both voice and data communications over the same physical base stations. Combined dual-mode networks include, but are not limited to, Code Division Multiple Access (CDMA) or CDMA2000 networks, GSM/GPRS networks (as mentioned above), and third-generation (3G) networks like EDGE and UMTS. Some older examples of data-centric networks include the Mobitex® Radio Network and the DataTAC® Radio Network. Examples of older voice-centric data networks include Personal Communication Systems (PCS) networks like GSM and Time Division Multiple Access (TDMA) systems.

Microprocessor 102 also interacts with additional subsystems such as memory 105 which may include a Random Access Memory (RAM) 106 and flash memory 108, display 110, auxiliary input/output (I/O) subsystem 112, serial port 114, keyboard 116, speaker 118, microphone 120, short-range communications 122 and other device subsystems 124.

Some of the subsystems of mobile device 100 perform communication-related functions, whereas other subsystems may provide "resident" or on-device functions. By way of example, keyboard 116 may be used for both communication-related functions, such as entering a text message for transmission over network 200, and device-resident functions such as a calculator, media player or task list. Operating system 103 software code used by microprocessor 102 is typically stored in a persistent store such as flash memory 108, which may alternatively be a read-only memory (ROM) or similar storage element (not shown). Those skilled in the art will appreciate that the operating system 103 software code, specific device applications, or parts thereof, may be temporarily loaded into a volatile store such as RAM 106.

In some embodiments, mobile device 100 may send and receive communication signals 90 over network 200 after required network registration or activation procedures have been completed. Network access is associated with a subscriber or user of a mobile device 100. To identify a subscriber, mobile device 100 requires a Subscriber Identity Module or "SIM" card 126 to be inserted in a SIM interface 128 in order to communicate with a network. SIM 126 is one type of a conventional "smart card" used to identify a subscriber of mobile device 100 and to personalize the mobile device 100, among other things. Without SIM 126, mobile device 100 is not fully operational for communication with network 200.

By inserting SIM 126 into SIM interface 128, a subscriber can access all subscribed services. Services could include: web browsing media transfers, such as music and/or image downloading or streaming, and messaging, such as e-mail, voice mail, Short Message Service (SMS), and Multimedia Messaging Services (MMS). More advanced services may include: point of sale, field service and sales force automation. SIM 126 includes a processor and memory for storing information. Once SIM 126 is inserted in SIM interface 128, it is coupled to microprocessor 102. In order to identify the subscriber, SIM 126 contains some user parameters such as an International Mobile Subscriber Identity (IMSI). An advantage of using SIM 126 is that a subscriber is not necessarily bound by any single physical mobile device. SIM 126 may store additional subscriber information for a mobile device as well, including datebook (or calendar) information and recent call information. In certain embodiments, SIM 126 may comprise a different type of user identifier and may be integral to mobile device 100 or not present at all.

Mobile device 100 is a battery-powered device and includes a battery interface 132 for receiving one or more rechargeable batteries 130 or other suitable power supplies. Battery interface 132 is coupled to a regulator (not shown), which assists battery 130 in providing power V+ to mobile device 100. Although current technology makes use of a battery, future technologies such as micro fuel cells may provide the power to mobile device 100.

Microprocessor 102, in addition to its operating system functions, enables execution of software applications on mobile device 100. A set of applications that control basic device operations, including data and voice communication applications, will normally be installed on mobile device 100 during its manufacture.

Additional applications may also be loaded onto mobile device 100 through network 200, auxiliary I/O subsystem 112, serial port 114, short-range communications subsystem 122, or any other suitable subsystem 124. This flexibility in application installation increases the functionality of mobile device 100 and may provide enhanced on-device functions, communication-related functions, or both. For example, secure communication applications may enable electronic commerce functions and other such financial transactions to be performed using mobile device 100.

Serial port 114 enables a subscriber to set preferences through an external device or software application and extends the capabilities of mobile device 100 by providing for information or software downloads to mobile device 100 other than through a wireless communication network. The alternate download path may, for example, be used to load an encryption key onto mobile device 100 through a direct and thus reliable and trusted connection to provide secure device communication.

Short-range communications subsystem 122 provides for communication between mobile device 100 and different systems or devices, without the use of network 200. For example, subsystem 122 may include an infrared device and associated circuits and components for short-range communication. Examples of short range communication would include standards developed by the Infrared Data Association (IrDA), Bluetooth®, and the 802.11 family of standards developed by IEEE.

In use, a received signal such as a voice call, text message, an e-mail message, or web page download will be processed by communication subsystem 104 and input to microprocessor 102. Microprocessor 102 will then process the received signal for output to display 110 or alternatively to auxiliary I/O subsystem 112. A subscriber may also compose data items, such as e-mail messages, for example, using keyboard 116 in conjunction with display 110 and possibly auxiliary I/O subsystem 112.

Auxiliary I/O subsystem 112 may include devices such as: a mouse, track ball, trackpad, infrared fingerprint detector, one or more roller wheels with dynamic button pressing capability, and a touch screen (which may operate in conjunction with display 110). Keyboard 116 comprises an alphanumeric keyboard and/or telephone-type keypad. A composed item may be transmitted over network 200 through communication subsystem 104. User input components comprised in auxiliary I/O subsystem 112 may be used by the user to navigate and interact with a user interface of mobile device 100.

For voice communications, the overall operation of mobile device 100 is substantially similar, except that the received signals would be output to speaker 118, and signals for transmission would be generated by microphone 120. Alternative voice or audio I/O subsystems, such as a voice message recording subsystem, may also be implemented on mobile device 100. Although voice or audio signal output is accomplished primarily through speaker 118, display 110 may also be used to provide additional information such as the identity of a calling party, duration of a voice call, or other voice call related information.

As a specific example of on-device functionality, there may also be provided a camera 136 which captures visual information in a digital format. To assist in taking photographs, a camera flash 138 may also be provided to operate in conjunction with camera 136 to provide lighting. In one embodiment, camera 136 may not only capture visual information to produce digital photographs, but may also be configured to operate individually or in conjunction with microphone 120 to capture digital videos. Such visual information may be displayed on display 110 before being stored, for example, in flash memory 108. There may also be camera application 107 stored in memory 105 operable to operate camera 136 or alter the image(s) taken by camera 136. Such application may be configured to modify the image(s) both before and/or after the image is stored.

Mobile device 100 further includes component cover subsystem 140, which is operable to provide a component cover 412 in the housing 402 of mobile device 100 over a first component referred to generally as 450 (discussed below in FIG. 4). As will be understood, in some embodiments, such component 450 may be in the form of camera lens 136, camera flash 138, display 110, biometric scanners such as for retinas or fingerprints (not shown), lighting features (not shown), virtual keypads (not shown), and/or battery doors (not shown). Other components may also be possible. Details of component cover subsystem 140 are described in greater detail below in relation to FIG. 4.

Referring now to FIG. 2, a block diagram of the communication subsystem component 104 of FIG. 1 is shown. As noted above, while example mobile device 100 of FIG. 1 may contain a communication subsystem 104 (herein described), it should be understood that such communication subsystem 104 may not be required for an embodiment of the present disclosure. Communication subsystem 104 comprises a receiver 150, a transmitter 152, one or more embedded or internal antenna elements 154, 156, Local Oscillators (LOs) 158, and a processing module such as a Digital Signal Processor (DSP) 160.

The particular design of communication subsystem 104 is dependent upon the network 200 in which mobile device 100 is intended to operate, thus it should be understood that the design illustrated in FIG. 2 serves only as one example. Signals 90 (FIG. 1) received by antenna 154 through network 200 are input to receiver 150, which may perform such common receiver functions as signal amplification, frequency down conversion, filtering, channel selection, and analog-to-digital (ND) conversion. ND conversion of a received signal 90 allows more complex communication functions such as demodulation and decoding to be performed in DSP 160. In a similar manner, signals to be transmitted are processed, including modulation and encoding, by DSP 160. These DSP-processed signals are input to transmitter 152 for digital-to-analog (D/A) conversion, frequency up conversion, filtering, amplification and transmission over network 200 via antenna 156. DSP 160 not only processes communication signals, but also provides for receiver and transmitter control. For example, the gains applied to communication signals in receiver 150 and transmitter 152 may be adaptively controlled through automatic gain control algorithms implemented in DSP 160.

The wireless link between mobile device 100 and a network 200 may contain one or more different channels, typically different RF channels, and associated protocols used between mobile device 100 and network 200. A RF channel is a limited resource that must be conserved, typically due to limits in overall bandwidth and limited battery power of mobile device 100.

When mobile device 100 is fully operational, transmitter 152 is typically keyed or turned on only when it is sending to network 200 and is otherwise turned off to conserve resources. Similarly, receiver 150 is periodically turned off to conserve power until it is needed to receive signals or information (if at all) during designated time periods.

The configuration and operation of an example electronic device, such as mobile device 100, in the present context is described in further detail in relation to FIGS. 4 to 8.

Figure 4:
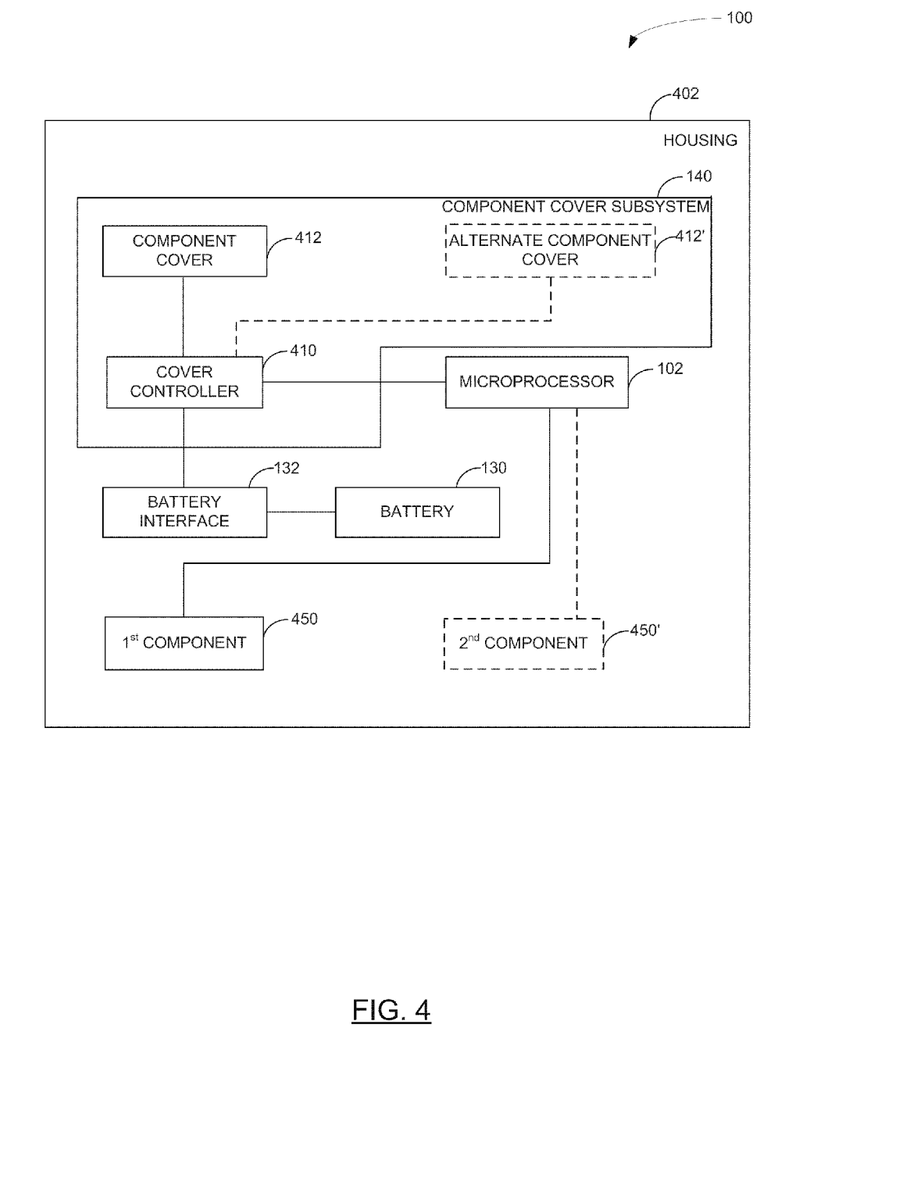
FIG. 4 is a block diagram showing in further detail the component cover subsystem of the electronic device of FIG. 1.

Referring to FIG. 4, therein illustrated is a block diagram showing the component cover subsystem 140 of mobile device 100 in FIG. 1 in greater detail. Component cover subsystem 140 is located in housing 402 and may include a component cover 412 in fixed relation to the housing 402 of mobile device 100, covering one or more components 450, 450' (e.g. camera 136 and/or camera flash 138). As discussed earlier, other components 450 suitable for use with component cover 412 of the present disclosure may include, for example, displays, biometric scanners (such as for retinas or fingerprints), lighting features, virtual keypads, or battery doors.

Component cover 412 may be configurable between at least a first and a second state. In a typical configuration, in the first state, the component cover 412 may be substantially or completely opaque, preventing or substantially preventing light to pass through it. In the second state, the component cover 412 may be substantially transparent, allowing a substantial amount of light to pass through it.

Figure 5A:
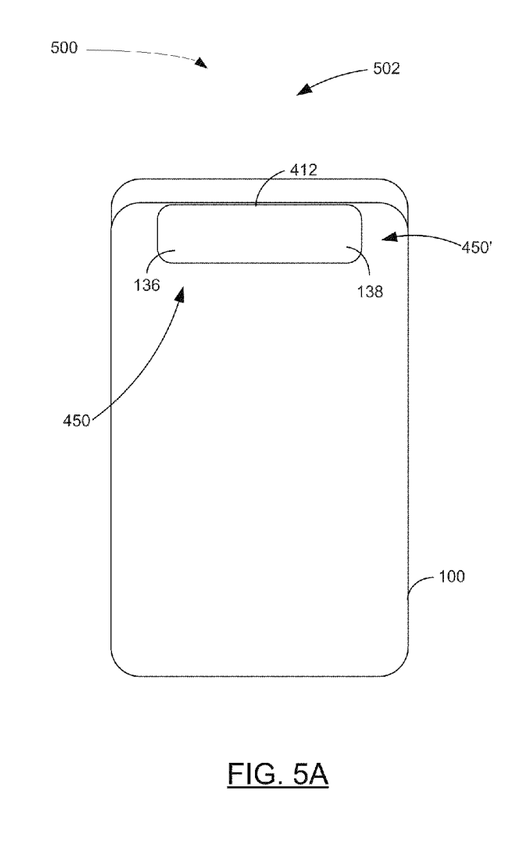
FIGS. 5A and 5B are exemplary embodiments of a single component cover of the electronic device of FIG. 1.
Figure 5B:
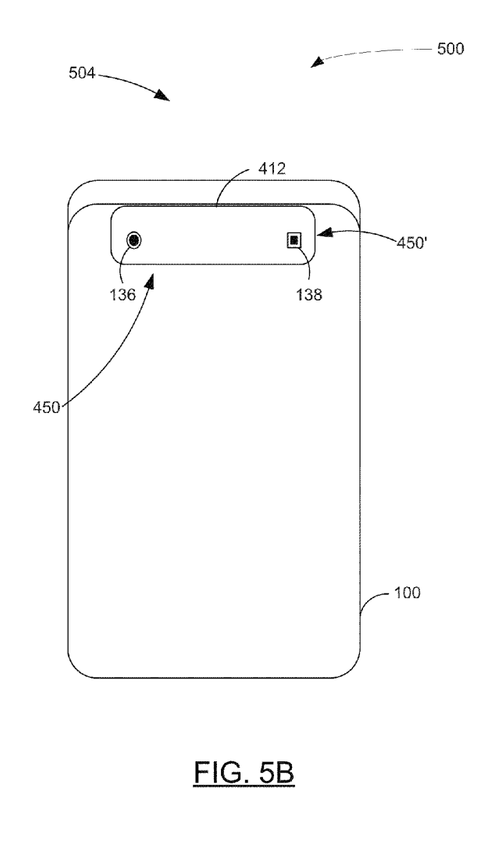

Referring briefly to FIGS. 5A and 5B, illustrated therein is an example embodiment of a component cover 412 in a first state and a second state, shown generally as 502 and 504 respectively. In the illustrated embodiment, the component cover 412 covers over camera 136 and camera flash 138 mounted within the housing 402 of mobile device 100. Referring to FIG. 5A, component cover 412 of mobile device 100 is shown in a substantially non-transparent (typically substantially opaque) first state 502. In such state 502, camera 136 and flash 138 may not be clearly visible from the outside of the mobile device 100. Referring to FIG. 5B, component cover 412 of mobile device 100 is shown in a substantially transparent second state 504, wherein both camera 136 and flash 138 are visible to an observer of mobile device 100, and the operation of such components 136, 138 is substantially unimpeded by the component cover 412.

Referring back to FIG. 4, cover controller 410 may be coupled to component cover 412, and may be configured to regulate the power supplied to, and hence vary the light transmissivity of, component cover 412. Cover controller 410 may also be connected to microprocessor 102, which is operable to send signals to cover controller 410 corresponding to the desired state or mode of light transmissivity of component cover 412.

Battery interface 132 may also be operatively connected to cover controller 410 to supply the power needed to modify the light transmissivity of component cover 412. Battery interface 132 may draw its power from a power supply, such as battery 130.

Component cover 412 may comprise electrochromic film, known also as electrochromatic film. This film may be operable to vary the amount of light transmitted through it depending on an electrical voltage applied across its thickness. Such film may be affixed to any substantially transparent material that is non-conductive and has suitable structural integrity, such as glass or Lexan® plastic. In its construction, such film may be affixed as a thin film laminate or as a layer sandwiched between two layers of substantially transparent material. When affixed, the result may commonly be referred to as "smart glass". While the term "smart glass" may be used herein, it will be understood that the technology described herein is not intended to be limited to "glass" as the electrochromic film may be affixed to any suitable material (as described) for component cover 412.

There may be multiple technologies known in the art capable of providing an electrochromic effect: in one embodiment, component cover 412 may comprise a suspended particle device (SPD); in an alternate embodiment, component cover 412 may comprise polymer dispersed liquid crystal (PDLC) film.

In an embodiment in which the component cover 412 is a SPD, when no voltage is applied to the component cover 412, the component cover 412 may be substantially opaque or dark in a first state or mode. When voltage is applied, the component cover 412 is operable to clear its appearance to become substantially transparent in a second state or mode.

In an embodiment in which the component cover 412 comprises PDLC film, when no voltage is applied to the component cover 412, the component cover 412 may be substantially opaque and may maintain a 'milky white' appearance in a first state or mode. When voltage is applied, component cover 412 is operable to clear its appearance to become substantially transparent in a second state or mode.

Cover controller 410 may comprise an integrated circuit (IC) capable of varying the voltage applied to component cover 412 based on signals from microprocessor 102 and power supplied by battery interface 132. In one embodiment, cover controller 410 may include a Sipex® SP4425 IC capable of generating a high voltage output from a single low voltage power source.

Figure 7:
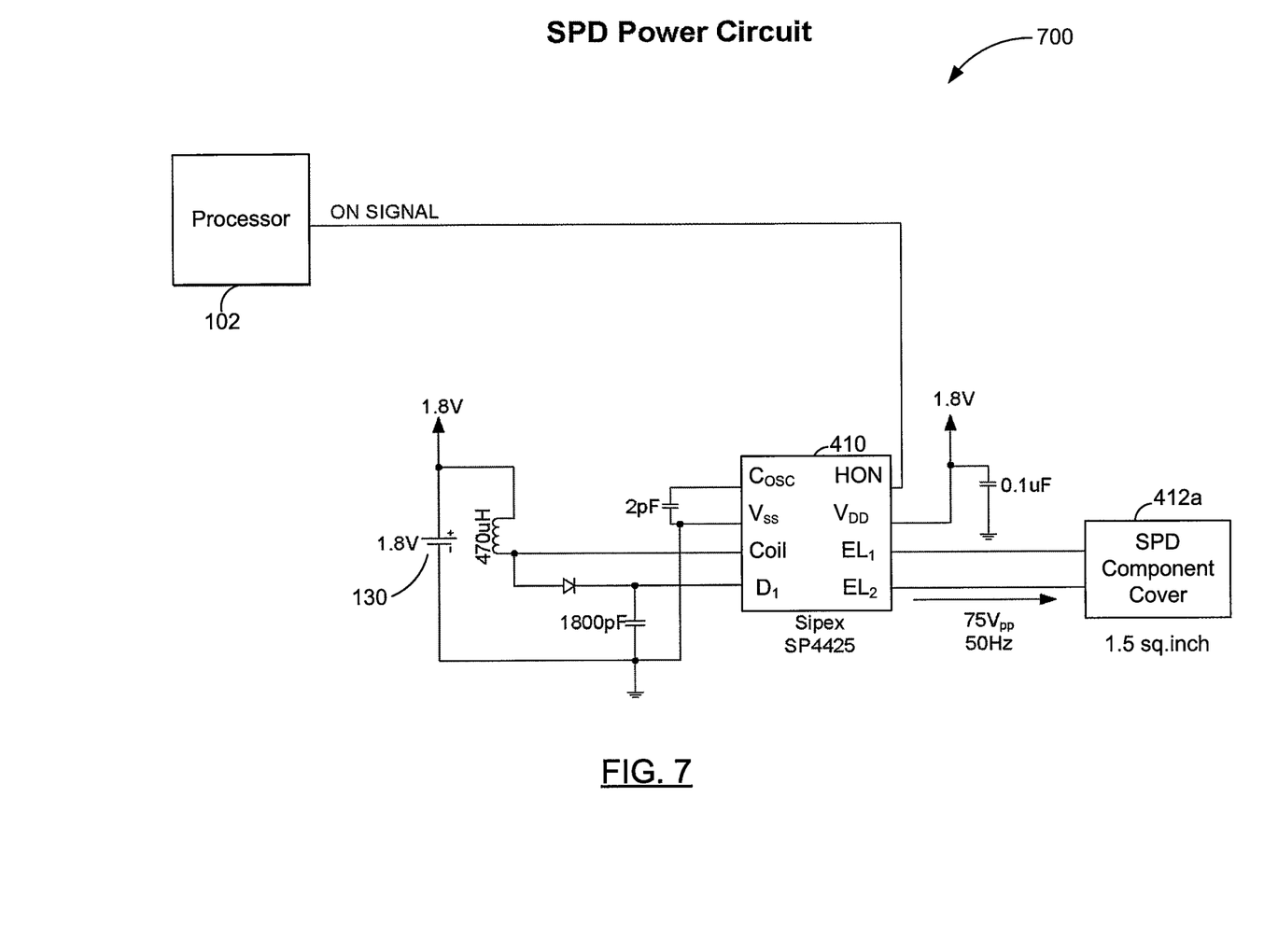
FIGS. 7 and 8 are exemplary schematic diagrams of an embodiment of the component cover subsystem of FIG. 1 employing a Sipex® SP4425 integrated circuit as the cover controller.
Figure 8:
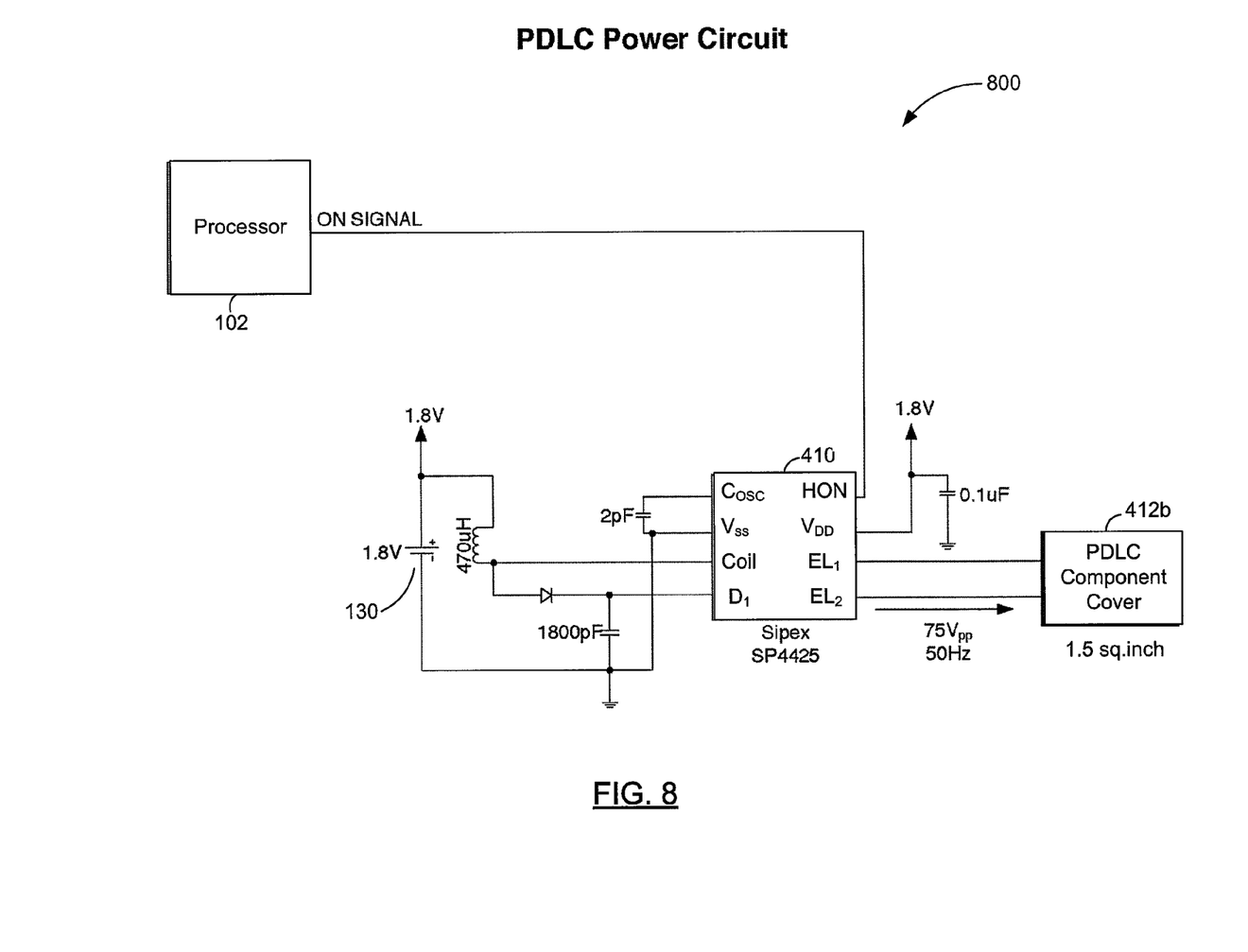

Referring briefly to FIGS. 7 and 8, illustrated therein are example schematic diagrams for incorporating a Sipex®

SP4425 IC with a component cover 412. Shown generally as 700 and 800, component cover 412a and 412b may comprise a SPD and PDLC film respectively. FIGS. 7 and 8 illustrate the electronic connections of a Sipex® SP4425 IC (410) with processor 102, power supply 130 (e.g., a battery) and example component covers 412a, 412b (of, in this example, 1.5 squared inches (approximately 9.68 squared centimeters) in size). Processor 102 may be connected to the HON pin of the Sipex® SP4425 IC, providing an input voltage (high or low) to the IC to indicate the desired state of component cover 412a, 412b. Correspondingly, the Sipex® SP4425 IC may be connected to a power supply 130 (e.g., a battery) so as to supply the power necessary to shift the component cover 412a, 412b between various states. A capacitor may connect the $C_{OSC}$ pin to the $V_{SS}$ pin, setting the oscillator frequency. The oscillator may also include a diode and a capacitor connected to the $D_1$ pin, and a coil connected to the Coil pin, so as to provide a clock source to control the charge and discharge phases for the coil and component cover 412. There may be an optimum $C_{OSC}$ capacitor value for a given inductance of the coil. The power supply for driver may be connected to the $V_{DD}$ pin. Pins $EL_1$ and $EL_2$ may connect to component cover 412a, 412b so as to provide the electrical signals to alter the states of component cover 412a, 412b.

If mobile device 100 is provided with multiple components 450, 450', in some embodiments, the mobile device 100 may be provided with one or more corresponding component covers 412, 412'. Referring briefly again to FIGS. 5A and 5B, illustrated therein is an example of a single component cover 412 configuration, referred to generally as 500. The configurations of FIGS. 5A and 5B employ one component cover 412 to cover two components 450, 450' (i.e., camera 136 and camera flash 138). Referring briefly to FIGS. 6A to 6D, illustrated therein are alternate embodiments of mobile device 100, shown generally as 600, using multiple component covers 412 and 412' to correspondingly cover separate components 450, 450' (i.e., camera 136 and camera flash 138).

Figure 6A:
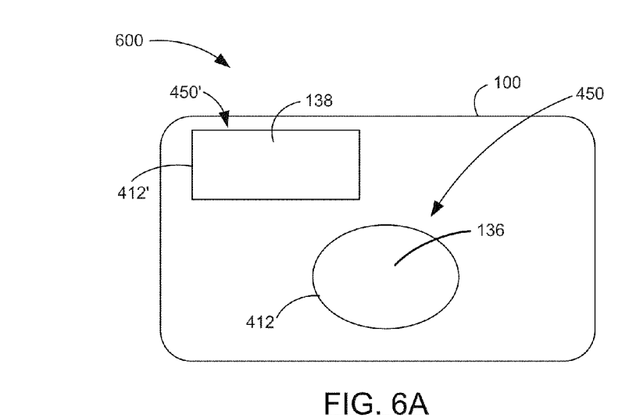
FIGS. 6A, 6B, 6C and 6D are further exemplary embodiments having multiple component covers of the electronic device of FIG. 1.
Figure 6B:
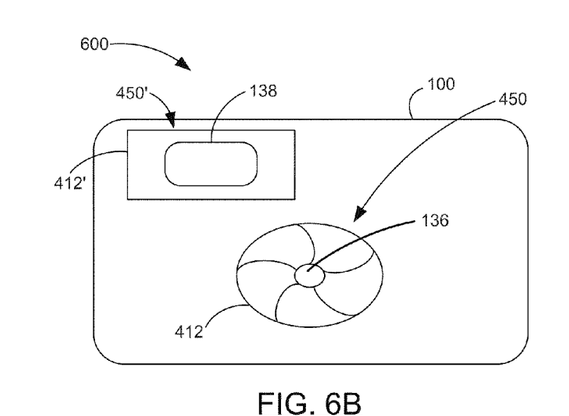
Figure 6C:
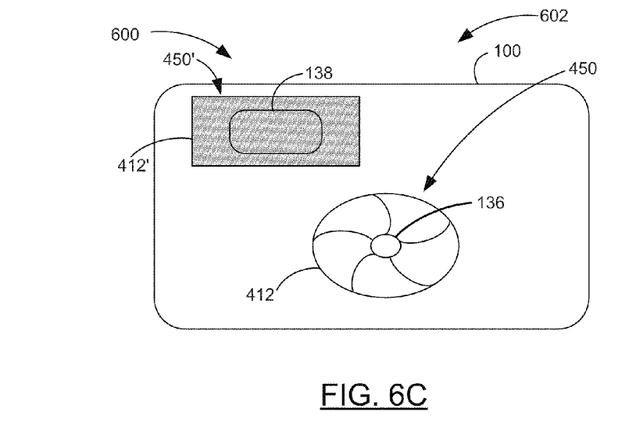
Figure 6D:
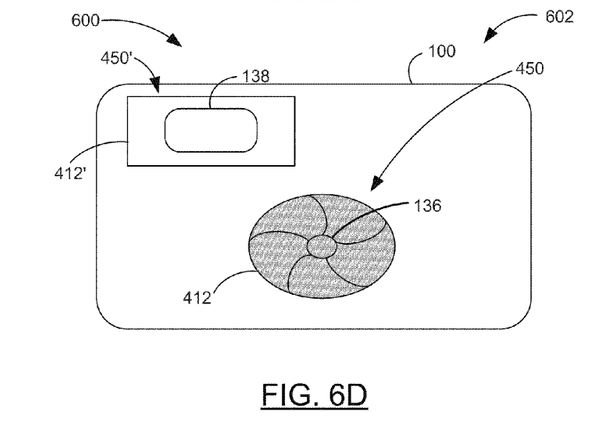

When there are multiple component covers 412, 412', cover controller 410 may control power from battery 130 through battery interface 132 to collectively configure component covers 412, 412' to be simultaneously in the same state. For example, FIG. 6A illustrates both component covers 412, 412' in a first (substantially opaque) state, and FIG. 6B illustrates both component covers 412, 412' in a second (substantially transparent) state. Alternatively, each component cover 412, 412' may be separately configured to be in a different state from the other(s). For example, FIG. 6C shows second component cover 412' over flash 138 in an additional or translucent state (discussed below) while first component cover 412 over camera 136 is in a second substantially transparent state, and FIG. 6D illustrates component cover 412 over camera lens 136 in an additional or translucent state (discussed below) while alternate component cover 412' over camera flash 138 may be in a second substantially transparent state.

When transitioning from a first or opaque state to a second or transparent state, there may be a delay before a component cover 412, 412' becomes substantially transparent (in the second state). For example, in some embodiments using a SPD, the transition time may be less than 1 second. In some embodiments using PDLC film, the transition time may, for example, be less than 10 milliseconds. As such, camera application 107 (FIG. 1) may be configured to wait for the component cover 412 to transition fully to the second (substantially transparent) state before beginning camera operation (e.g. before recording visual information for camera 136 or emitting light for flash 138). The impact of such delay may be reduced if operating system 103 is configured to perform the transitioning of the component cover 412 in parallel with the launching of camera application 107.

Alternatively, operating system 103 may be configured to anticipate the usage of camera 136 and camera flash 138. In such an embodiment, operating system 103 (FIG. 1) may begin to transition component covers 412, 412' to the second or substantially transparent state before the camera 136 is used. For example, operating system 103 may interpret the entering of a media folder on the user interface of mobile device 100 as an indication that the camera 136 and/or flash 138 may potentially be used. As such, it may start the process of transitioning component covers 412, 412' to a second or substantially transparent state so that they will be in a substantially transparent state sooner. Such configuration may reduce the impact of the delay experienced by a user attempting to use camera 136 and/or flash 138.

Such configuration may, however, cause additional battery drain because of wasted transitions of component cover 412 when the camera 136 is not actually used. As such, further alternate embodiments may be configured to keep track of the navigation flow of operating system 103 before the camera application 107 is invoked so as to only begin transitioning component cover 412 to a transparent state when there is a reasonable likelihood that camera lens 136 and/or flash 138 may be used.

Referring simultaneously to FIGS. 5A and 6A, illustrated therein are component covers 412, 412' in a first (substantially opaque) state being configured to be of a desired colour (e.g., white). Such colour may be configured to be of the same colour (e.g. white) as a portion of the housing 402 of mobile device 100 such that the two colours correspond to each other. However, the colours of component cover 412 available to be selected may depend on the ability to configure and/or tint the "smart glass" of component covers 412, 412' to desired colours without substantially negatively impacting the desired performance of the corresponding covered component(s) 450, 450'. As such, the availability of colours for component covers 412, 412' may be more limited than the availability of colours for the housing 402 of mobile device 100. In such case, at the time of manufacture, it may be preferable to select the colour of component cover 412 first, and then subsequently select the colour of a portion of the housing of mobile device 100 to correspond to the selected colour of the component cover 412 in its first (substantially opaque) state. Such selection order will increase the likelihood that the colours correspond favorably to each other. It will be understood that other colours (for example, black or lavender) are also within the contemplation of the present disclosure.

In alternate embodiments, the colour of the component covers 412, 412' and/or the housing 402 of mobile device 100 may be selected so as not to correspond to each other. Such selection of alternate colors may, for example, allow the casing of mobile device 100 to appear distinctive or artistic.

In such embodiments, a selected colour of the component covers 412, 412' may create a tint over camera 136 and flash 138 respectively, even when the component cover 412, 412' is in its second or substantially transparent state. Raw photographs taken under such conditions may reflect this tint and not produce a desired or accurate image. Camera application 107 (FIG. 1) may be configured to provide a software filter to remove such tint before the digital photograph is recorded onto memory 105. Alternatively, if desired, such tint may be allowed to remain to provide an optical effect (similar to a colour filter) on the photograph.

Referring again to FIGS. 6C and 6D, therein illustrated are component covers 412, 412' being operable to be in at least one translucent state (referred to herein also as an "additional state"), shown generally as 602. In such state, component cover 412, 412' may be configured to allow diffused light to pass through. Referring to FIG. 6C, the effect of the additional or translucent state is illustrated by the flash 138 being partially viewable beneath component cover 412', and in FIG. 6D, camera 136 being partially viewable beneath component cover 412. In an embodiment where the component covers 412, 412' comprises a SPD or PDLC film, the translucency of component covers 412, 412' may be variable on a substantially continuous scale depending on the voltage provided to the component covers 412, 412' by a power supply such as battery 130 as regulated by the battery interface 132 and cover controller 410 (FIG. 4).

Such an additional translucent state(s) may have particular application to photographic components such as camera 136 and flash 138. For example, such translucency may be desirable to create an optical effect on a photograph being taken. Referring to FIG. 6C, configuring alternate component cover 412' over flash 138 to be in an additional or translucent state may cause a diffusion of the light emitted by flash 138. Such effect may be desirable for users of camera 136 to reduce harshness of the light by spreading and softening the light. In another scenario, referring to FIG. 6D, configuring component cover 412 over camera 136 to be in a translucent state may create an effect of blurriness in the resultant digital photograph. As noted, the degree of translucency may be controlled by varying the voltage applied to component covers 412, 412'. It will be understood that translucent states amongst different component covers 412, 412' may be employed separately, together or in various combination to form a desired photographic effect.

Referring back to FIG. 4, power drain from battery 130 caused by varying the light transmissivity of component cover 412 may depend on the material producing the electrochromic effect (e.g., a SPD or PDLC film) and the size of component cover 412. In an embodiment in which a camera lens 136 and flash 138 are being covered by a single component cover 412 (such as in FIGS. 5A and 5B), the size of component cover 412 may often be no larger than one square inch (approximately 6.45 square centimeters). The small size of component cover 412 may reduce the battery drain caused by component cover 412 (although larger and smaller sizes of component cover 412 are also within the contemplation of the present disclosure). It should also be understood that using an IC as a cover controller 410 designed for use in mobile devices (e.g. the Sipex® SP4425 IC mentioned above) may help to ensure that power drain is minimized.

Specifically, in an example component cover comprising a SPD, the current required may be 40 mA, applied once for every time the component cover 412 needs to transition between the first or substantially opaque state and the second or substantially transparent state. For a component cover comprising PDLC film, the power consumption is rated at 10 mW/m². Accordingly, for an example component cover 412 of approximately one square inch (approximately 6.45 squared centimeters), this will be 0.0254 m*0.0254 m*10 mW/m²=0.006 mW. Relating this to current with a nominal voltage of 120V, the resulting current required for a PDLC film embodiment may approximately be 50 uA. Employing the Sipex® SP4425 IC as an example cover controller 410 (which may operate at 80% efficiency), the embodiment employing SPD film would require 40*1.2=48 mA from the battery 130 for each transition between a first or substantially opaque state and a second or substantially transparent state, and vice versa. For the embodiment comprising PDLC film, approximately 50*1.2=60 uA would be drawn from the battery to maintain the substantially transparent state. Comparatively, in a mobile device having radio communications such as described in FIG. 1, there may be applications that may require 40 mA continuously when the mobile device 100 is in operation or in standby.

As a further comparison, such power drain may be examined in light of the capacity of a typical battery in a mobile device (e.g. 1400 mA). If a mobile device 100 having component cover 412 comprised of PDLC film is used to record a video, component cover 412 may need to remain in a substantially transparent state for an extended period of time. For example, for a long video length of 6 hours, the draw required to maintain the second (substantially transparent) state of the component cover 412 may be approximately 22 mA (6 hrs*60 min*60 uA=22 mA). This may be a small portion of the total capacity (1400 mA) of an example battery 130 of mobile device 100. As such, the additional power drain caused by transitioning component cover 412 between a first substantially opaque state and a second substantially transparent state (and/or sustaining the second substantially transparent state) will likely not materially impact the battery life of mobile device 100.

Referring to FIG. 3, therein illustrated is a flowchart for an example method of varying the aesthetic properties of an electronic device 100 of the present disclosure, shown generally as 300. A housing may be provided for the electronic device (step 310). At least one component may be mounted within the housing 402 (step 312). At least one component cover 412 in fixed relation to the housing 402 may also be provided (step 314). The at least one component cover 412 is selected to be configurable between at least a first state and a second state. Greater light transmissivity is allowed through the component cover(s) when it is in the second state than when it is in the first state. Component cover(s) 412 may be configured in a second state prior to using the component(s) (step 316), and component cover(s) 412 may be configured in a first state when the at least one component is not in use (step 318).

The steps of a method in accordance with any of the embodiments described herein may not be required to be performed in any particular order, whether or not such steps are described in claims or otherwise in numbered or lettered paragraphs.

While the above description provides example embodiments, it will be appreciated that some features and/or functions of the described embodiments are susceptible to modification without departing from the spirit and principles of operation of the described embodiments. Accordingly, what has been described above is intended to be illustrative of the claimed concept and non-limiting.

For example, while component cover 412 has been described as covering example components camera 136 and flash 138, component cover 412 may also be provided to cover additional non-electronic components. Such components may include a logo on the housing 402 of mobile device 100, or a serial number (e.g. an electronic serial number (ESN) operable to identify a mobile device on a CDMA cellular network) that may typically only be accessed by visually inspecting an identifier placed on the interior of the housing after the removal of the battery cover. Such logo or identifier may be concealed or revealed by operation of the various states of the component cover 412.

Moreover, although camera 136 and flash 138 have been illustrated as being on the same side of the housing of a mobile device 100, such components 450, 450' may be located in different locations in the housing. Specifically, additional or alternate components may be placed on other locations of the housing, such as on the front side of a mobile device 100.

It will be understood by persons skilled in the art that the features of the housings illustrated with reference to the example components described herein are provided by way of example only. It will be understood by persons skilled in the art that variations are possible in variant implementations and embodiments.

The invention claimed is:

1. An electronic device comprising:
   (a) a housing;
   (b) a component mounted within the housing;
   (c) a component cover in fixed relation to the housing;
   (d) wherein the component cover is configurable between at least a first state and a second state;
   (e) wherein light transmissivity through the component cover is greater when in the second state than when in the first state; and
   (f) wherein the component cover is configurable to be translucent in at least one additional state.

2. The electronic device of claim 1 wherein in the first state the component cover is substantially opaque.

3. The electronic device of claim 1 wherein in the second state the component cover is substantially transparent.

4. The electronic device of claim 2 wherein the component cover in the first state is coloured.

5. The electronic device of claim 4 wherein the colour of at least a portion of the housing corresponds to the colour of the component cover in the first state.

6. The electronic device of claim 1, further comprising:
   (a) a power supply operatively coupled to the component cover; and
   (b) a cover controller operatively coupled to the power supply and configured to control the power supplied to the component cover by the power supply.

7. The electronic device of claim 1 wherein the component cover comprises electrochromic film.

8. The electronic device of claim 1 wherein the component cover comprises at least one selected from the group consisting of: electrochromic glass, polymer dispersed liquid crystal film and a suspended particle device.

9. The electronic device of claim 1 wherein the component comprises a camera lens.

10. The electronic device of claim 1 wherein the component comprises a camera flash.

11. The electronic device of claim 1 further comprising
    (a) at least one alternate component mounted within the housing;
    (b) at least one alternate component cover in fixed relation to the housing;
    (c) wherein the alternate component cover is separately configurable between at least a first state and a second state; and
    (d) wherein light transmissivity through the alternate component cover is greater when in the second state than when in the first state.

12. An electronic device comprising:
    (a) a housing;
    (b) a component mounted within the housing;
    (c) a component cover in fixed relation to the housing;
    (d) a power supply operatively coupled to the component cover;
    (e) a cover controller operatively coupled to the power supply and configured to control the power supplied to the component cover by the power supply; and
    (f) wherein the component cover is configurable to vary its light transmissivity on a substantially continuous scale in response to the power supplied to the component cover by the power supply.

13. The electronic device of claim 12, wherein the component cover comprises electrochromic film.

14. The electronic device of claim 12 wherein the component cover comprises at least one selected from the group consisting of: electrochromic glass, polymer dispersed liquid crystal film and a suspended particle device.

15. The electronic device of claim 12, wherein the component comprises at least one selected from the group consisting of: a camera lens and a camera flash.

16. A method comprising:
    (a) providing a housing for an electronic device;
    (b) providing a component mounted within the housing;
    (c) providing a component cover in fixed relation to the housing;
    (d) configuring the component cover between at least a first state and a second state;
    (e) wherein light transmissivity through the component cover is greater when in the second state than when in the first state; and
    (f) wherein the component cover is configurable to be translucent in at least one additional state.

17. The method of claim 16, wherein the component cover comprises electrochromic film.

18. The method of claim 16 further comprising
    (g) configuring the component cover in the second state prior to using the component.

19. The method of claim 16 further comprising
    (g) configuring the component cover in the first state when the component is not in use.

\* \* \* \* \*